United States Patent [19]
Imai

[11] Patent Number: 5,502,399
[45] Date of Patent: Mar. 26, 1996

[54] POWER SEMICONDUCTOR DEVICE WITH A GATE WITHSTAND-VOLTAGE TEST TERMINAL

[75] Inventor: Hiroshi Imai, Kariya, Japan

[73] Assignee: Nippondenso Co., Ltd., Aichi-Pref, Japan

[21] Appl. No.: 264,046

[22] Filed: Jun. 22, 1994

[30] Foreign Application Priority Data

Jun. 23, 1993 [JP] Japan .................................. 5-151953

[51] Int. Cl.⁶ .................................................. G01R 31/28
[52] U.S. Cl. .................................................. 324/765
[58] Field of Search ............................... 324/73.1, 158.1, 324/763, 765; 371/22.1, 22.5, 22.6, 15.1, 22.2, 22.3; 257/362, 392; 377/74; 326/81, 83; 437/8; 327/530

[56] References Cited

U.S. PATENT DOCUMENTS

| | | | |
|---|---|---|---|
| 4,677,317 | 6/1987 | Sakuma | 377/74 |
| 4,833,395 | 5/1989 | Sasaki et al. | 324/763 |
| 4,928,157 | 5/1990 | Matsunaga et al. | 257/362 |

FOREIGN PATENT DOCUMENTS

2288366  11/1990  Japan .

*Primary Examiner*—Vinh P. Nguyen
*Attorney, Agent, or Firm*—Cushman Darby & Cushman

[57] ABSTRACT

A power semiconductor device comprises a MOSFET 32 having a gate oxide film 63 formed on a semiconductor substrate 51 and a gate voltage applying circuit 33 integrally formed on the semiconductor substrate 51. The gate voltage applying circuit 33 which includes Zener diode 41a converts a DC power source voltage into a constant gate driving voltage using the Zener diode 41a. The gate voltage applying circuit applies the gate driving voltage to a gate of MOSFET 32 in response to a gate trigger signal. A test mode setting terminal CHK is provided for setting a test mode-by which a test voltage higher than the gate driving voltage is applied to the gate of the MOSFET 32 in a gate withstand voltage test. A test-use Zener diode 41b is provided in the gate voltage applying circuit 33 and connected in series with Zener diode 41a. A switching transistor 42, connected in parallel with the test-use Zener diode 4b, responds to a signal given from the test mode setting terminal CHK to short-circuit test-use Zener diode 4b in a normal operating condition, the short-circuit condition of the test-use Zener diode 4b being released in a gate withstand voltage test condition so that the test voltage is applied to the gate of the MOSFET 32 in the gate withstand voltage test ,the test voltage being higher than the gate driving voltage.

3 Claims, 5 Drawing Sheets

POWER SEMICONDUCTOR DEVICE WITH A GATE WITHSTAND-VOLTAGE TEST TERMINAL

BACKGROUND OF THE INVENTION

1. Field of the Invention

The present invention relates to a power semiconductor device which is an integrated circuit (IC) incorporating a power semiconductor element having a gate, that is insulated from the semiconductor substrate by a thin oxide film layer, and a voltage applying circuit for applying a predetermined voltage to the gate of the power semiconductor element.

2. Related Art

Generally known as power semiconductor device having a thin oxide layer insulating a gate from the semiconductor substrate is, for example, a power MOSFET (i.e., metal oxide semiconductor field-effect transistor). From the necessity of forming the gate oxide film very thin in such a MOSFET, the manufacturing of the same usually encounters with thickness dispersion in the formation of this thin oxide film, the degree of which generally approximates the thickness of a wafer.

The thickness dispersion of thin oxide film is directly related to the withstand voltage at the gate of the power MOSFET when completely manufactured as a product.

To prevent possible initial defects, particularly those occurring when a predetermined voltage is applied to the MOSFET gate, gate withstand voltage tests are normally conducted in a wafer condition or a product-assembled condition before finishing manufacturing of a product. This assures the ability of the gate to withstand a voltage within a pre-designated range. The level of gate withstand voltage to be assured, in this case, is set higher than the normally applied gate voltage in operation This helps to compensate for a decline in the gate's withstanding ability due to deterioration in quality of its oxide film layer. Similarly, to test reliability of the gate withstand voltage, a gate voltage that may be higher than that in the normal operation is applied.

On the other hand, the gate oxide film of the power MOSFET, which is very thin as described above, may be damaged when exposed to a voltage exceeding the gate withstand voltage. Such a voltage may result from static electricity or excessive voltage generated in the handing or operating condition. To prevent such an accidental damage, one of prior art technologies teaches interposing a Zener diode between the gate terminal and the source terminal of the power semiconductor element beforehand. According to this conventional technology, Zener voltage of the Zener diode is set lower than the gate withstand voltage. This arrangement prevents the gate oxide film from being damaged when an excessive voltage is applied to the gate, because the Zener diode is broken down first so as to absorb the excessive voltage applied.

However, above-described break-down of Zener diode is disadvantageous in that, when a higher gate voltage is intentionally applied to a power MOSFET in the gate withstand voltage test, a voltage actually applied to the gate is limited within the Zener voltage of the Zener diode which is smaller than that of the required gate voltage for the withstand voltage test, thus resulting in impossibility or failure of test.

Figure 7:
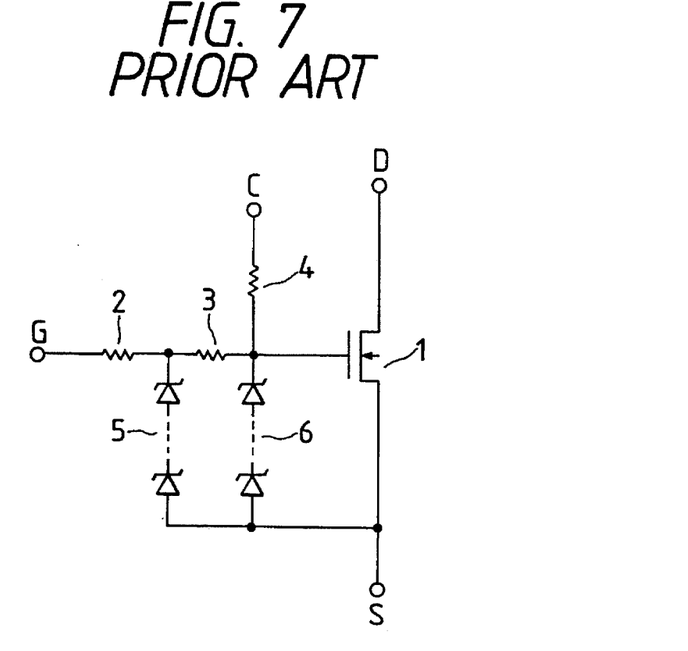
FIG. 7 is a circuit diagram showing an equivalent circuit of a conventional power semiconductor device.

Unexamined Japanese Patent Application No. HEI 2-288366/1990 solves such problems by independently providing a gate terminal for test use only as shown in an equivalent circuit of FIG. 7. A gate terminal G, serving as an external terminal, is connected to a gate of a power MOSFET 1 through serial resistances 2 and 3. A gate testing terminal C is connected to the gate of the power MOSFET 1 through a resistance 4. A gate protecting Zener diode 5 is interposed between a common connecting point joining the resistances 2, 3 and a source S of the power MOSFET 1. A test-use Zener diode 6 is interposed between the gate and the source of the power MOSFET 1. Zener voltages VZ1 and VZ2 of these Zener diodes 5 and 6 — for example, VZ1=6V and VZ2=36V satisfy the relationship of VZ1<VZ2.

In operation, the power MOSFET 1 is activated in an operating condition upon reception of a gate signal from the gate terminal G. If an excessive voltage is applied to the gate terminal G and exceeds the Zener voltage VZ1, the Zener diode 5 causes breakdown based on its Zener effect which results in absorption or elimination of the excessive voltage received. Thus, the gate of the power MOSFET 1 is not subjected to any excessive voltage at all.

In a gate withstand voltage test or an execution of gate screening, a testing voltage is applied to the gate testing terminal C. As the gate testing terminal C is connected through the resistance 3 to the Zener diode 5, the magnitude of a voltage applied to the gate testing terminal C can be increased up to the Zener voltage VZ2 of the testing Zener diode 6 which is larger than the Zener voltage VZ1 of the Zener diode 5. Thus, the gate screening of the power MOSFET 1 can be executed by applying a voltage higher than a normal operation voltage.

However, this circuit raises such a problem that switching speed is undesirably reduced due to existence of the resistance 3. More specifically, the gate of the power MOSFET 1 has a significant amount of capacitance which is likely to increase a time constant of charge/discharge when combined with a resistance such as the resistance 3. Hence, the reduction of switching speed reflects such an increase of time constant of charge/discharge.

SUMMARY OF THE INVENTION

Accordingly, in view of above-described problems encountered in the prior art, a principal object of the present invention is to provide a novel and useful, intelligent power semiconductor device incorporating various circuits, such as a driving circuit, a protecting circuit, and an IC unit, the device permitting application of a test voltage for executing a withstand voltage test or screening of gate oxide film which is higher than a normal gate driving voltage given by the protecting circuit, without deteriorating properties or performance of the device.

In order to accomplish this and other related objects, a first aspect of the present invention provides a power semiconductor device comprising: a power semiconductor element having a gate oxide film formed on a semiconductor substrate; a gate voltage applying circuit integrally formed on the semiconductor substrate, the gate voltage applying circuit converting power source voltage into a constant gate voltage and applying the constant gate voltage to a gate of the power semiconductor element in response to a trigger signal, so that the power semiconductor element is turned on when received the constant gate voltage; wherein the gate voltage applying circuit including first and second voltage applying means: the first voltage applying means being effected, when the power semiconductor element is in a normal operating condition, to apply a predetermined gate driving voltage to the gate of the power semiconductor element; the second voltage applying means being effected, when the power semiconductor element is in a gate withstand voltage test condition, to apply a predetermined test voltage to the gate of the power semiconductor element, the predetermined test voltage being higher than the predetermined gate driving voltage; and the first and second voltage applying means assuring the power semiconductor element of the same switching operation without lowering switching speed.

A second aspect of the present invention provides a power semiconductor device comprising: a power semiconductor element having a gate oxide film formed on a semiconductor substrate; a gate voltage applying circuit integrally formed on the semiconductor substrate, the gate voltage applying circuit including constant-voltage means and converting power source voltage into a constant gate driving voltage by a function of the constant-voltage means and applying the gate driving voltage to a gate of the power semiconductor element in response to a gate trigger signal; a test mode setting terminal for setting a test mode by which a test voltage higher than the gate driving voltage is applied to the gate of the power semiconductor element in a gate withstand voltage test; test-use constant-voltage means provided in the gate voltage applying circuit and connected in series with the constant-voltage means; a switching element connected in parallel with the test-use constant-voltage means, the switching element responding to a signal given from the test mode setting terminal in such a manner that the test-use constant-voltage means is short-circuited by the switching element in a normal operating condition while short-circuit condition of the test-use constant-voltage means is released in a gate withstand voltage test condition, thereby applying the test voltage higher than the gate driving voltage to the gate of the power semiconductor element in the gate withstand voltage test.

In the above second aspect of the present invention, it is preferable that Zener diodes are used for the constant-voltage means and the test-use constant-voltage means.

Furthermore, a third aspect of the present invention provides a power semiconductor device comprising: a power semiconductor element having a gate oxide film formed on a semiconductor substrate; a constant-voltage circuit integrally formed on the semiconductor substrate and converting power source voltage into a constant voltage in response to a gate trigger signal; an amplification circuit including a resistance element and converting an output voltage of the constant-voltage circuit into a predetermined gate driving voltage using the resistance element and applying the gate driving voltage to a gate of the power semiconductor element; a test mode setting terminal for setting a test mode by which a test voltage higher than the gate driving voltage is applied to the gate of the power semiconductor element in a gate withstand voltage test; a test-use resistance element provided in the amplification circuit and connected in series with the resistance element; a switching element connected in parallel with the test-use resistance element, the switching element responding to a signal given from the test mode setting terminal in such a manner that the test-use resistance element is short-circuited by the switching element in a normal operating condition while short-circuit condition of the test-use resistance element is released in a gate withstand voltage test condition, thereby applying the test voltage higher than the gate driving voltage to the gate of the power semiconductor element in the gate withstand voltage test.

In accordance with the power semiconductor device of the present invention, in the normal operating condition, to apply the gate driving voltage to the gate terminal of the power semiconductor element, the gate trigger signal is given to the gate voltage applying circuit and then a constant-voltage is outputted therefrom by the function of the constant-voltage element. In this case, the gate voltage applying circuit is in a condition where the switching element is turned on. Therefore, the test-use constant voltage means is short-circuited; the gate driving voltage having a constant value determined by the constant-voltage means is thus outputted. As the gate driving voltage is maintained at the predetermined value by the function of the constant-voltage means, the gate of the power semiconductor element is prevented from being subjected to and damaged by an excessive voltage.

Meanwhile, when the gate withstand voltage is tested, a setting signal is given through the test mode setting terminal. Upon input of this setting signal, the switching element is turned off. Therefore, short-circuit condition of the test-use constant-voltage means is released. Thus, the gate voltage applying circuit can output a test voltage having a value larger than the gate driving voltage, which is equal to a sum of the constant voltage given by the test-use constant-voltage means and the gate driving voltage given by the constant-voltage means. Hence, it becomes possible to apply the test voltage to the gate of the power semiconductor element by inputting a gate trigger signal, thus allowing a gate withstand voltage test to be surely executed. Through this gate withstand voltage test, it is checked whether a gate oxide film of a product, which may be insufficient in thickness due to manufacturing error, has an acceptable rated voltage higher than the gate driving voltage in the normal operation. Furthermore, to evaluate reliability of a product, acceleration test is also conducted by applying a higher test voltage to the gate of the power semiconductor element.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

First of all, a basic technology for the invention will be explained. This technology includes an intelligent power semiconductor device integrating, such as an IC unit, the semiconductor substrate, on which a power MOSFET is formed, and various circuits, such as a protecting circuit, a driving circuit and a control circuit.

Figure 8:
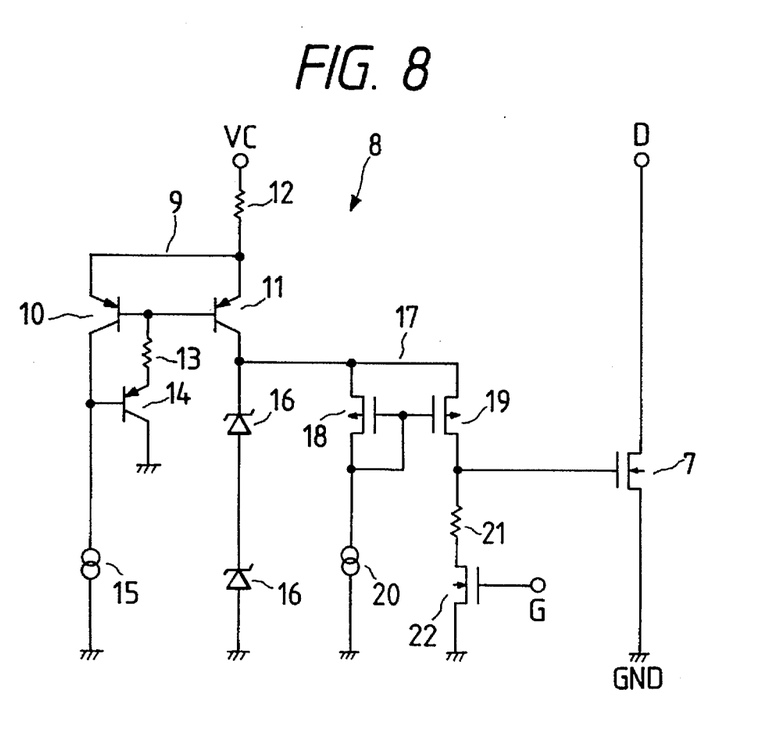
FIG. 8 is a circuit diagram showing an equivalent circuit of an intelligent power semiconductor device.

FIG. 8 is an equivalent circuit of such an intelligent power semiconductor device, wherein an N-channel type power MOSFET 7, acting as power semiconductor element, is integrally formed with a driving circuit 8 applying a constant voltage to the gate of this power MOSFET 7. The power MOSFET 7 has a drain connected to a drain terminal D and a source connected to a ground terminal GND.

The driving circuit 8 comprises p-n-p type transistors 10, 11 which are paired to constitute a current mirror circuit 9. These p-n-p type transistors 10, 11 have emitters jointed together and connected to a terminal VC of DC electric power source through a resistance 12. Bases of these p-n-p type transistors 10, 11 are also jointed together and connected to the ground terminal GND through a resistance 13 and the emitter-collector of a p-n-p type transistor 14. A collector of the transistor 10 is connected to the ground terminal GND through a constant-current circuit 15 and is further connected to a base of the transistor 14. A collector of the transistor 11 is connected to the ground terminal GND through two serial Zener diodes 16, 16.

The driving circuit 8 also comprises p-channel type MOSFETs 18, 19 which are paired to constitute a current mirror circuit 17. These p-channel type MOSFETs 18, 19 have drains jointed together and connected to the collector of the transistor 11. Gates of these p-channel type MOSFETs 18, 19 are also jointed together and connected to a source of the MOSFET 18. The source of the MOSFET 18 is connected to the ground terminal GND through a constant-current circuit 20. The source of the other MOSFET 19 is connected, on one hand, to the gate of the power MOSFET 7 and is connected, on the other hand, to the ground terminal GND through a resistance 21 and the drain-source of an n-channel type MOSFET 22 which has a gate serving as a gate terminal G through which a trigger signal is given.

In operation, when the driving circuit 8 receives a trigger signal given from the gate terminal G under a condition where electric power is supplied through the DC power source terminal VC, the current mirror circuits 9, 17 and the Zener diodes 16, 16 interact to supply the gate of the power MOSFET 7 with a constant voltage Whose magnitude depends on a total Zener voltage of a plurality of — two (in this embodiment)— Zener diodes 16, 16. As a constant voltage is always obtainable by virtue of the function of Zener diodes 16, 16 even if the DC electric power source causes fluctuation, the gate oxide film is surely prevented from being damaged.

However, according to the nature of such a basic intelligent power semiconductor device, there is raised a problem that, even if a higher voltage is intentionally supplied through the DC power source terminal VC for some purposes (e.g., withstand voltage test or screening), the gate of the power MOSFET 7 is never given a higher voltage exceeding the above-explained constant voltage determined by the Zener diodes 16, 16.

To resolve this problem, it may be proposed to add a special testing terminal which is directly connected to the gate of power MOSFET 7. However, this is not effective since current begins flowing through the source-drain of the MOSFET 19 when an applied voltage from the testing terminal is higher than the withstand voltage of Zener diodes 16, 16, even if the withstand voltage at the drain-source of the trigger-use MOSFET 22 is set larger than the testing voltage (e.g., gate withstand voltage). Thus, it is concluded that the voltage appliable to the gate of the power MOSFET 7 is substantially restricted by Zener diodes 16, 16.

As another method, it may be proposed to provide a resistance equivalent to the resistance 3 of the conventional power semiconductor device explained with reference to FIG. 7 so as to be interposed between the collector of the transistor 11 and the drains of MOSFETs 18, 19. In this case, however, another problem is raised, although the gate withstand voltage test becomes feasible. The problem is that switching speed is unexpectedly reduced due to existence of this resistance newly added for test use. More specifically, the gate of the power MOSFET 7 has a significant amount of capacitance which is likely to increase a time constant of charge/discharge when combined with the test-use resistance. Thus, the increase of time constant of charge/discharge directly results in reduction of switching speed. Such a problem is, as explained, similarly found in the conventional power semiconductor device of FIG. 7. Consequently, adoption or addition of a test-use resistance is not preferable when a product is required to respond quickly with an adequate switching speed.

The present invention resolves such problems and provides a novel and useful, intelligent power semiconductor device, preferable embodiments of which will be explained with reference to FIGS. 1 to 6.

Figure 1:
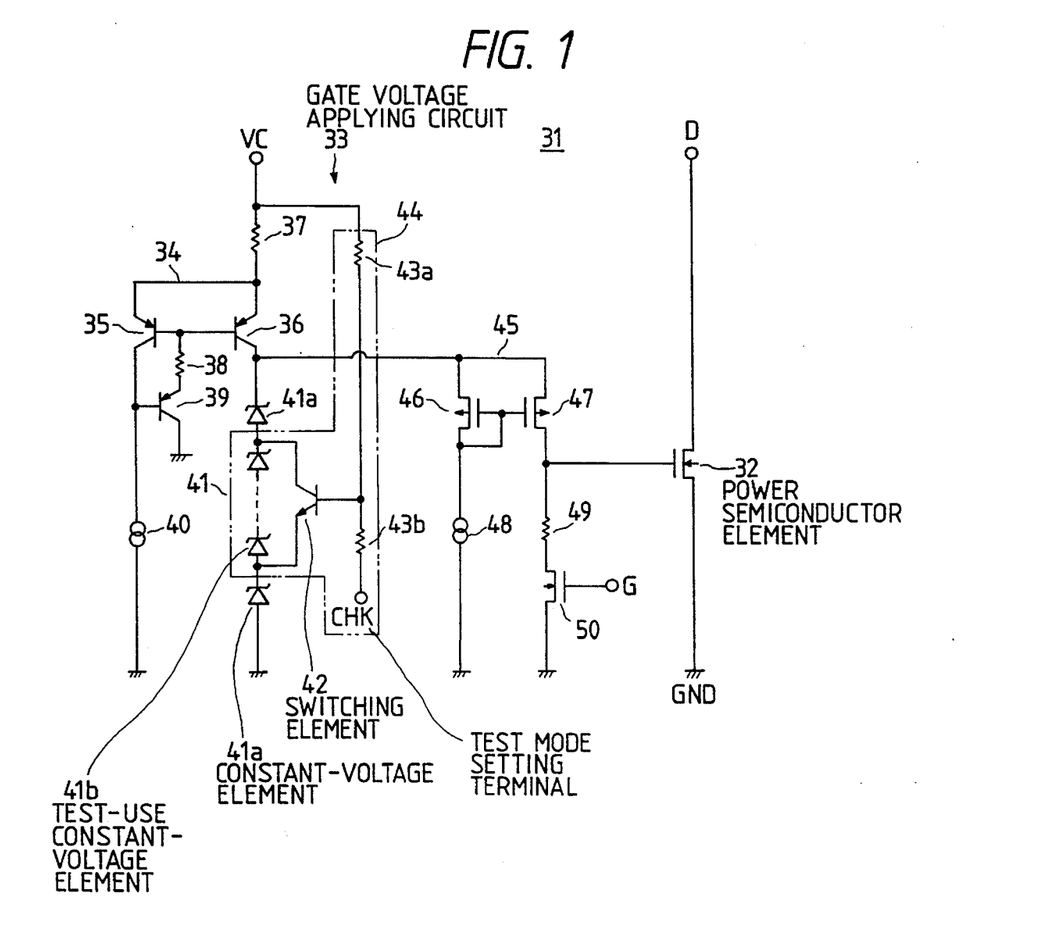
FIG. 1 is a circuit diagram showing an equivalent circuit of a power semiconductor device in accordance with a first embodiment of the present invention.

FIG. 1 is an equivalent circuit of a power MOSIC (i.e. metal oxide semiconductor integrated circuit) 31 in accordance with a first embodiment of the present invention. The power MOSIC 31 comprises an n-channel type power MOSFET 32, acting as power semiconductor element that has a gate oxide film on a chip, and a driving circuit 33 that is integrally formed with power MOSFET 32 for applying a constant voltage to the gate of power MOSFET 32. The power MOSFET 32 has a drain connected to a drain terminal D and a source connected to a ground terminal GND.

The driving circuit 33 comprises p-n-p type transistors 35, 36 which are paired to constitute a current mirror circuit 34. These p-n-p type transistors 35, 36 have emitters jointed together and connected to a terminal VC of DC electric power source through a resistance 37. Bases of these p-n-p type transistors 35, 36 are also jointed together and connected to the ground terminal GND through a resistance 38 and the emitter-collector of a p-n-p type transistor 39. A collector of the transistor 35 is connected to the ground terminal GND through a constant-current circuit 40 and is further connected to a base of the transistor 39. A collector of the transistor 36 is connected to the ground terminal GND through a plurality of serial Zener diodes 41 (i.e. 41a, 41b). Properties and performance of these transistors 35 and 36 are identical with each other.

Of these plural Zener diodes 41, a predetermined number of Zener diodes 41a provide as a whole a Zener voltage VZ1 which determines a protecting voltage in operation of this power semiconductor device. The remaining Zener diodes 41b provide as a whole a Zener voltage VZ2 which is added with the above Zener voltage VZ1 to give a test voltage in the gate withstand voltage test. An n-p-n type transistor 42, acting as a switching element, is connected in parallel with the Zener diodes 41b, so as to interpose these Zener diodes 41b, between the collector and emitter of this n-p-n type transistor 42. A base of the transistor 42 is connected to the DC power source terminal VC through a resistance 43a and is further connected through a resistance 43b to a test mode setting terminal CHK which is to be set in the gate withstand voltage test. In short, Zener diodes 41b, switching transistor 42, resistances 43a, and test mode setting terminal CHK cooperatively function as a setting circuit 44 for the gate withstand voltage test. The withstand voltage at the collector-emitter of the transistor 42 is set larger than the Zener voltage VZ2 of the Zener diodes 41b, 41b.

The driving circuit 33 further comprises p-channel type MOSFETs 46, 47 which are paired to constitute a current mirror circuit 45. These p-channel type MOSFETs 46, 47 have drains jointed together and connected to the collector of the transistor 36. Gates of these p-channel type MOSFETs 46, 47 are also jointed together and connected to a source of the MOSFET 46. The source of the MOSFET 46 is connected to the ground terminal GND through a constant-current circuit 48. The source of the other MOSFET 47 is connected, on one hand, to the gate of the power MOSFET 32 and is connected, on the other hand, to the ground terminal GND through a resistance 49-and the drain-source of an n-channel type MOSFET 50 which has a gate serving as a gate terminal G through which a trigger signal is given. The withstand voltage at the drain-source of the MOSFET 50 is set larger than the sum of Zener voltages — i.e. (VZ1+VZ2)— of the Zener diodes 41a, 41a, 41b, 41b.

Figure 2:
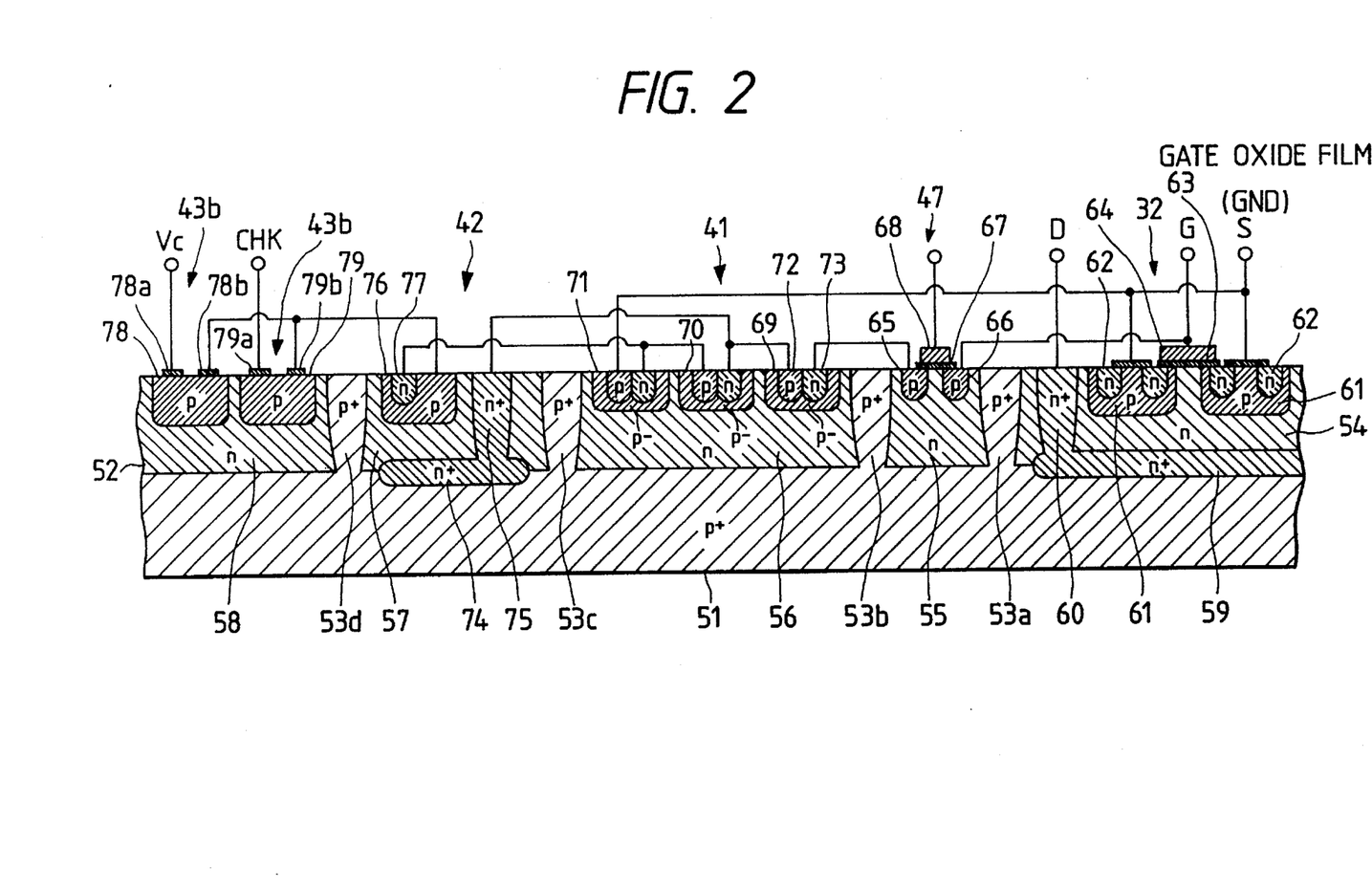
FIG. 2 is a vertical cross-sectional view partly showing the power semiconductor device in accordance with the first embodiment of the present invention.

FIG. 2 is a cross-sectional view showing a chip embodying the above-described circuit therein. This chip comprises a p-type silicon substrate 51, on which an n-type epitaxial layer 52 is deposited or grown. An upper surface of this epitaxial layer 52 qualifies as a main surface of the chip. The epitaxial layer 52 is divided into five n-type regions 54, 55, 56, 57 and 58 by four p-type separating regions 53a, 53b, 53c and 53d which are diffused from the main surface of the chip to reach the silicon substrate 51. In practice, these n-type regions 54 through 58 are formed by the surround p-type separating regions 53a through 53d.

The n-type region 54 comprises a high density n-type buried layer 59, which is formed in the boundary of the silicon substrate 51 and the epitaxial layer 52, and a high density n-type diffusion layer 60 connected to the buried layer 59. A drain electrode D is extractably provided on this n-type region 54 which acts as a drain region. A plurality of p-type diffusion regions 61 that channels are provided in the n-type region 54. Each p-type diffusion region 61 includes two n-type diffusion regions 62, therein. A gate oxide film 63, having a predetermined film thickness, is formed on the main surface of the chip so as to bridge the n-type diffusion regions 62, of adjacent two p-type diffusion regions 61. A gate electrode 64, made from polycrystalline silicon, is formed on the gate oxide film 63. Thus, the n-type region 54 constitutes the power MOSFET 32.

The n-type region 55 comprises two p-type diffusion regions 65, 66 corresponding to drain and source regions. A gate oxide film 67, having a predetermined film thickness, is formed on the main surface of the chip so as to bridge the p-type diffusion regions 65, 66. A gate electrode 68, made from polycrystalline silicon, is formed on this gate oxide film 67. Thus, the n-type region 55 constitutes a p-channel type MOSFET 47.

The n-type region 56 comprises a plurality of p-type diffusion regions 69, 70 and 71, each including a high density p-type diffusion region 72 and a high density n-type diffusion region 73 which cooperatively form a diode having a p-n junction. Thus, the n-type region 56 constitutes a series of Zener diodes 41.

The n-type region 57 comprises a high density n-type buried layer 74, which is formed in the boundary of the silicon substrate 51 and the epitaxial layer 52, and a high density n-type diffusion layer 75 connected to this buried layer 74. A collector electrode is extractably provided on this n-type region 57 which acts as a collector region. A p-type diffusion region 76, forming a base region, is provided in the n-type region 57. This p-type diffusion region 76 includes a high density n-type diffusion region 77 which forms an emitter region. Thus, the n-type region 57 constitutes an n-p-n type transistor 42.

The n-type region 58 comprises p-type diffusion regions 78, 79 acting as resistance. The p-type diffusion region 78 has two electrodes 78a, 78b on the surface thereof, while the p-type diffusion region 79 has two electrodes 79a, 79b on the surface thereof. These p-type diffusion regions 78, 79 correspond to the resistances 43a, 43b of FIG. 1. The electrode 78a is connected to the DC power source terminal VC, and the electrode 79a is connected to the test mode setting terminal CHK.

Drain terminal D, source terminal S (i.e. ground terminal GND), DC power source terminal VC and gate terminal G are respectively connected to a bonding pad (not shown), and are connected to external lead terminals by means of bonding wire in the installation of device. Other components not shown in FIG. 2 are also integrally formed on or in the chip utilizing known diffusion technologies. By electrically connecting components as shown in FIG. 1, the power MOSIC 31 is eventually completed.

An operation of this first embodiment will be explained below.

First explained is a normal operation in use. That is, the test mode setting terminal CHK is set in the opened condition before DC electric power is supplied through the terminal VC. In this condition, a base bias voltage is given to the base of the switching transistor 42 through the resistance 43a, thus the switching transistor 42 is turned on. Accordingly, Zener diodes 41b, interposed between the emitter and collector of the switching transistor 42 are substantially short-circuited; thus, the collector voltage of the transistor 36 is reduced to a voltage equivalent to the Zener voltage of the Zener diodes 41a.

Subsequently, if a trigger signal is given through the gate terminal G, a predetermined voltage, whose magnitude is determined on the basis of the total Zener voltage of Zener diodes 41a, 41a, is applied to the gate of the power MOSFET 32, so as to turn on the power MOSFET 32. In this condition, if a higher voltage exceeding the total Zener voltage of Zener diodes 41a is accidentally applied to the gate of the power MOSFET 32, the Zener diodes 41a cause breakdown. Thus, the Zener diodes 41a act as a means for absorbing or eliminating excessive voltage applied to the gate of the power MOSFET 32. In other words, the gate oxide film 63 of the power MOSFET 32 is prevented from being damaged by the function of Zener diodes 41a.

Meanwhile, a gate withstand voltage test for the power MOSFET 32 is executed in the following manner. First, the test mode setting terminal CHK is set in the ground level. Upon this grounding operation, the bias voltage given to the base of the switching transistor 42 is lowered so that the switching transistor 42 is turned off. Thus, the short-circuit condition of the Zener diodes 41b is released, and the Zener diodes 41b are virtually connected in series with the Zener diodes 41a. Accordingly, the collector voltage of the transistor 36 is increased up to a voltage equivalent to the overall Zener voltage VZ of all the Zener diodes 41a, 41b which is the sum of Zener voltage (i.e. VZ=VZ1+VZ2). If a test voltage required to execute the gate screening is applied under such a condition through the DC power source terminal VC, this test voltage can be increased up to the overall Zener voltage VZ.

In this case, as the withstand voltage at the drain-source of the trigger-use MOSFET 50 is set higher than the overall voltage VZ, the gate of the power MOSFET 32 can be given a desired voltage within a range of the overall Zener voltage VZ in the gate withstand test.

According to the first embodiment of the present invention described in the foregoing description, Zener diodes 41b are serially connected to the Zener diodes 41a, and the switching transistor 42 is provided to short-circuit only the Zener diodes 41b when it is activated. Thus, in the gate withstand voltage test, the test mode setting terminal CHK is grounded to turn off the switching transistor 42, thereby releasing the short-circuit condition of the Zener diodes 41b so that a higher test voltage can be applied to the gate of the power MOSFET 32. This embodiment is advantageous in that the switching speed, which is an excellent performance of the power MOSFET 32, is not reduced at all.

Figure 3:
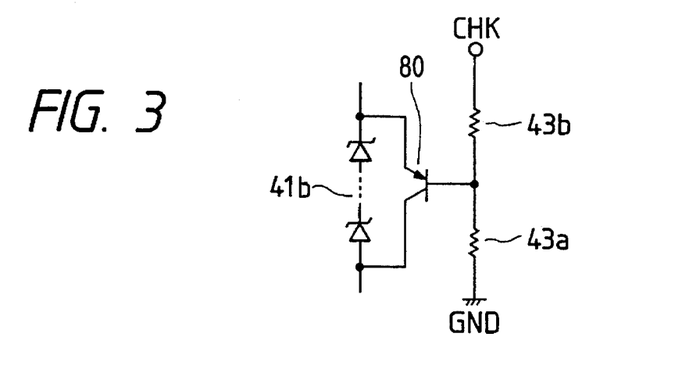
FIG. 3 is a circuit diagram showing an equivalent circuit of an essential part of a power semiconductor device in accordance with a second embodiment of the present invention.

FIG. 3 is a circuit diagram showing an equivalent circuit of an essential part of a power semiconductor device in accordance with a second embodiment of the present invention. The second embodiment is different from the first embodiment in that the switching transistor 42 is replaced by an p-n-p type transistor 80 whose base is connected through the transistor 43a to the ground terminal GND and is further connected through the resistance 43b to the test mode setting terminal CHK.

When the test mode setting terminal CHK is in the opened condition, the base of the switching transistor 80 is in the same potential as the ground terminal GND and, therefore, the switching transistor 80 is turned on, thereby short-circuiting the Zener diodes 41b. Thus, a voltage appliable to the gate of the power MOSFET 32 ranges up to the predetermined voltage determined by the Zener diodes 41a.

Meanwhile, if a voltage close to the DC electric power voltage is given to the test setting terminal CHK, the switching transistor 80 is turned off to release the short-circuit condition of the Zener diodes 41b thereby increasing an overall Zener voltage by adding Zener voltage VZ2 of the Zener diodes 41b to Zener voltage VZ1 of the Zener diodes 41a. Thus, a higher voltage can be applied to the base of the power MOSFET 32. Hence, substantially the same function and effect as the first embodiment can be obtained according to the second embodiment.

Figure 4:
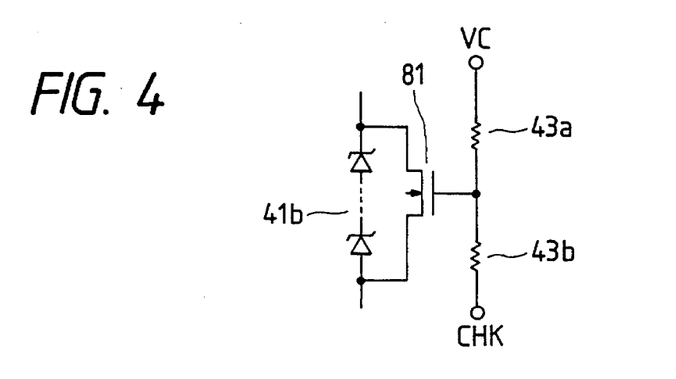
FIG. 4 is a circuit diagram showing an equivalent circuit of an essential part of a power semiconductor device in accordance with a third embodiment of the present invention.

FIG. 4 is a circuit diagram showing an equivalent circuit of an essential part of a power semiconductor device in accordance with a third embodiment of the present invention. The third embodiment is different from the first embodiment in that the switching transistor 42 is replaced by an n-channel type MOSFET 81 having a base connected through the transistor 43a to the DC power source terminal VC and further connected through the resistance 43b to the test mode setting terminal CHK. The third embodiment has substantially the same function and effect as the first embodiment, and therefore will be no more explained.

Figure 5:
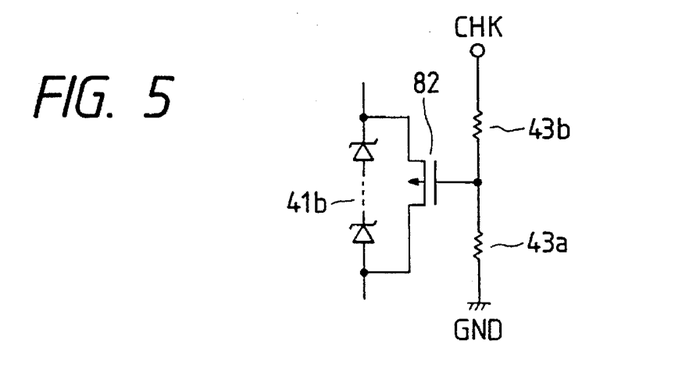
FIG. 5 is a circuit diagram showing an equivalent circuit of an essential part of a semiconductor device in accordance with a fourth embodiment of the present invention.

FIG. 5 is a circuit diagram showing an equivalent circuit of an essential part of a semiconductor device in accordance with a fourth embodiment of the present invention. The fourth embodiment is different from the second embodiment in that the switching transistor 80 is replaced by a p-channel type MOSFET 82 having a base connected through the transistor 43a to the ground terminal GND and further connected through the resistance 43b to the test mode setting terminal CHK. The fourth embodiment has substantially the same function and effect as the second embodiment, and therefore will be no more explained.

Although the above embodiments are explained based on the n-channel type power MOSFET 32 acting as power semiconductor, it is needless to say that the present invention is not limited to the disclosed one. Therefore, the present invention can be embodied on other power semiconductor elements, such as a p-channel type power MOSFET or an IGBT (insulated gate bipolar transistor).

Although the above embodiments are explained based on the Zener diodes 41 which are formed using diffusion from the main surface of the silicon substrate 51, it is needless to say that the Zener diodes 41 can be formed on an insulating film grown on the surface by using polycrystalline silicon.

Although the above embodiments are explained based on the test mode setting terminal CHK connected to the external lead terminal by means of bonding pad, it is possible to touch the test mode setting terminal CHK which is in a wafer condition by a test probe (a needle electrode) only when a check is required. In this case, it is only necessary to form on a chip a pad having an area to which the probe is touchable. Thus, it becomes possible to reduce the size of pad.

Figure 6:
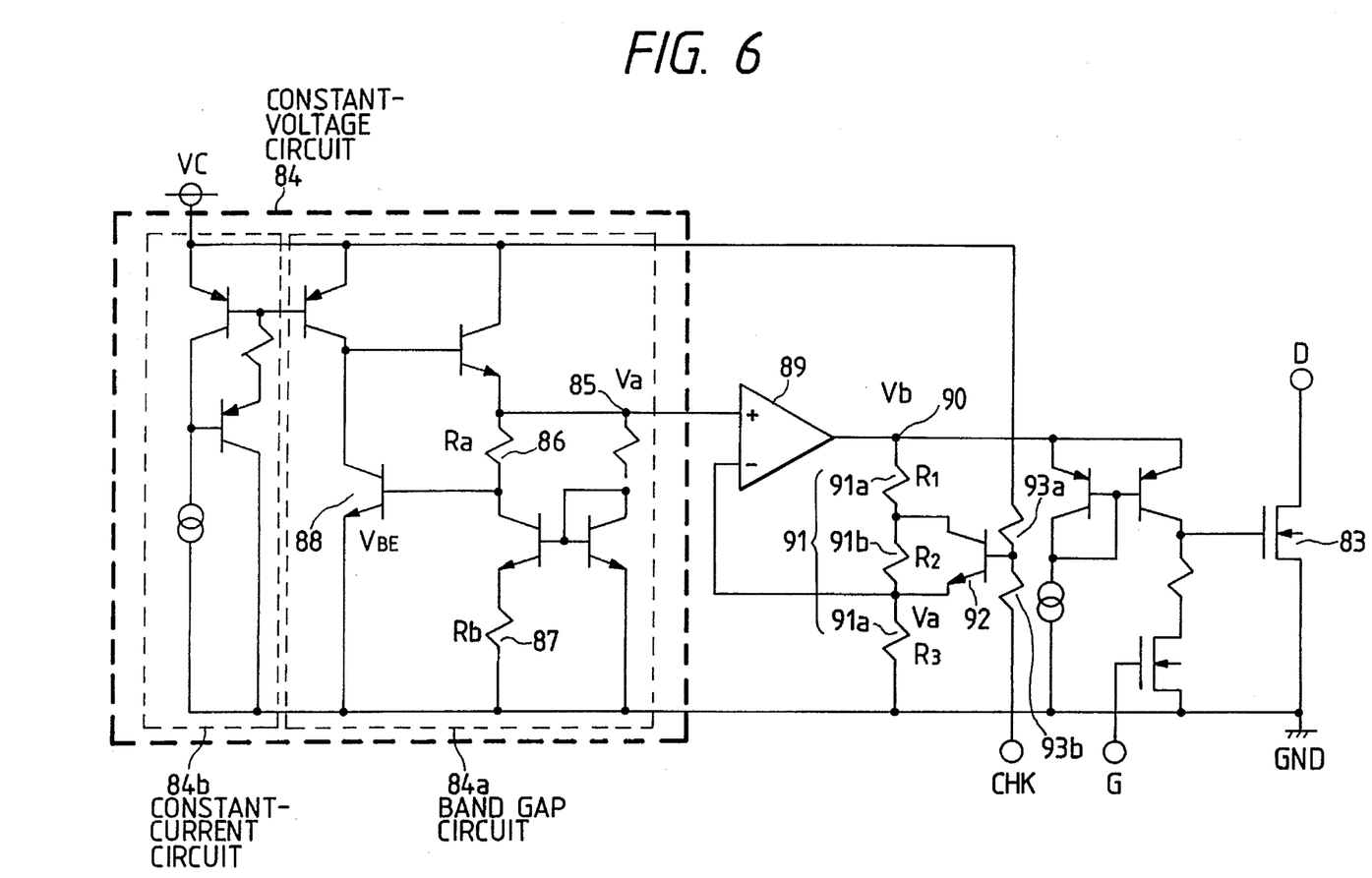
FIG. 6 is a circuit diagram showing an equivalent circuit of a power semiconductor device in accordance with a fifth embodiment of the present invention.

FIG. 6 is a circuit diagram showing an equivalent circuit of a power semiconductor device in accordance with a fifth embodiment of the present invention. This fifth embodiment is different from above first to fourth embodiments in that a constant-voltage circuit 84 driving a power semiconductor 83 does not include the constant-voltage elements (Zener diodes) 41a and the gate withstand voltage test constant-voltage elements (Zener diodes) 41b.

In FIG. 6, the constant-voltage circuit 84 consists of a band gap circuit 84a and a constant-current circuit 84b. With the construction of the band gap circuit 84a shown in FIG. 6, an output voltage Va of an output stage 85 of the constant-voltage circuit 84 is expressed in the following equation (1), using a base-emitter voltage $V_{BE}$ of a transistor 88 and resistance values Ra, Rb of resistances 86, 87 in the band gap circuit 84a.

$$Va = V_{BE} + Ra/Rb \times A \qquad (1)$$

wherein A is a constant.

In practice, Va is usually 1.25 V. The output voltage Va of the output stage 85 is amplified by an operational amplifier 89. An output voltage Vb of an output stage 90 of the operational amplifier 89 is given to the gate of the power semiconductor element 83, thereby driving the power semiconductor element 83.

The fifth embodiment further includes an improvement for varying the gate driving voltage Vb. That is, the output of the operational amplifier 89 is connected to the ground terminal GND through a series of resistances 91. Of these serially connected plural resistances 91 (three resistances 91a, 91b and 91a in this embodiment), some resistances (two resistances identified as 91a having resistance values R1, R3, respectively) provide the output stage 90 with the above-described gate driving voltage Vb which is a protecting voltage in the normal operating condition. The remaining resistances (only one resistance 91b having a resistance value R2 in this embodiment) provide an additional voltage for gate withstand voltage test, which is added with the gate driving voltage Vb. An n-p-n type transistor 92, acting as switching element, is connected in parallel with this test-use resistance 91b in such a manner that this test-use resistance 91b is interposed between the collector and emitter of the n-p-n type transistor 92. The base of this n-p-n type transistor 92 is connected to the DC power source terminal VC through a resistance 93a and is further connected through a resistance 93b to the test mode setting terminal CHK which is set for the gate withstand test.

An operation of the fifth embodiment is substantially the same as that of above-described first to fourth embodiments and, therefore, will be simply explained below.

First, in the normal operating condition, the test mode setting terminal CHK is in the opened condition to turn on the switching transistor 92, thus the resistance 91b is short-circuited. In this condition, the value of gate driving voltage Vb at the output stage 90 is expressed in the following equation (2).

$$Vb=\{(R1+R3)/R3\}\times Va \qquad (2)$$

Meanwhile, in the gate withstand voltage test, the test mode setting terminal VHK is grounded to turn off the switching transistor 92, thus releasing the short-circuit condition of the test-use resistance 91b. Accordingly, the value of the test voltage Vb' at the output stage 90 is expressed in the following equation (3).

$$Vb'=\{(R1+R2+R3)/R3\}\times Va \qquad (3)$$

Thus, it becomes possible to execute the gate withstand voltage test by supplying the gate of the power semiconductor element 83 with the test voltage Vb' which is higher than the gate driving voltage Vb.

According to the fifth embodiment, the same function and effect as the previously explained embodiments can be obtained.

An n-channel type power MOSFET or a p-channel type power MOSFET or an IGBT can be used as power semiconductor element 83 used in the fifth embodiment.

In accordance with the power semiconductor device of the present invention, the test-use constant-voltage element is connected in series with the constant-voltage element and the switching element is connected in parallel with this test-use constant-voltage element to short-circuit the test-use constant-voltage element only. On-and-off operation of this switching element is controlled by the setting signal given through the test mode setting terminal. When the gate withstand voltage is tested, the setting signal is input through this test mode setting terminal to turn off the switching element, thereby releasing the short-circuit condition of the rest-use constant-voltage element. Thus, the gate voltage applying circuit can output a test voltage having a value larger than the gate driving voltage, which is equal to a sum of the constant voltage given by the test-use constant-voltage element and the gate driving voltage given by the constant-voltage element. Hence, it becomes possible to apply the test voltage to the gate of the power semiconductor element by inputting a gate trigger signal, thus allowing a gate withstand voltage test to be surely executed. In this case, the present invention is advantageous in that the switching operation of the power semiconductor element can be assured so that the switching speed is not reduced.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A power semiconductor device comprising:

a power semiconductor element having a gate oxide film formed on a semiconductor substrate;

a gate voltage applying circuit integrally formed on said semiconductor substrate, said gate voltage applying circuit converting a power source voltage into a constant gate voltage and applying said constant gate voltage to a gate of said power semiconductor element in response to a trigger signal so that said power semiconductor element is turned on when receiving said constant gate voltage said gate voltage applying circuit including: first voltage applying means for applying a predetermined gate driving voltage to said gate of said power semiconductor element when said power semiconductor element is in a normal operating condition, and second voltage applying means for applying a predetermined test voltage to said gate of said power semiconductor element when said power semiconductor element is in a gate withstand voltage test condition, said predetermined test voltage being higher than said predetermined gate driving voltage; and a switching speed of said semiconductor element being constant when voltage is received from said first and second voltage applying means 2. A power semiconductor device comprising:

a power semiconductor element having a gate oxide film formed on a semiconductor substrate;

a gate voltage applying circuit integrally formed on said semiconductor substrate, said gate voltage applying circuit including constant-voltage means, said gate voltage applying circuit converting a power source voltage into a constant gate driving voltage and applying said constant gate driving voltage to a gate of said power semiconductor element in response to a gate trigger signal;

a test mode setting terminal for setting a test mode by which a test voltage is applied to said gate of said power semiconductor element in a gate withstand voltage test, said test voltage being higher than said gate driving voltage;

test-use constant-voltage means provided in said gate voltage applying circuit and connected in series with said constant-voltage means;

a switching element connected in parallel with said test-use constant-voltage means, said switching element short-circuiting said test-use constant-voltage means in response to a signal produced by said test mode setting terminal under normal operating condition, said short-circuiting condition of said test-use constant-voltage means being released during said gate withstand voltage test condition so that said test voltage is applied to said gate of said power semiconductor element during said gate withstand voltage test.

3. A power semiconductor device in accordance with claim 2, wherein said constant-voltage means and said test-use constant-voltage means are Zener diodes.

* * * * *